(12) United States Patent
Onishi

(10) Patent No.: US 9,166,029 B2
(45) Date of Patent: Oct. 20, 2015

(54) METHOD FOR MANUFACTURING SEMICONDUCTOR DEVICE

(71) Applicant: Toru Onishi, Nagoya (JP)

(72) Inventor: Toru Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/151,065

(22) Filed: Jan. 9, 2014

(65) Prior Publication Data

US 2014/0213019 A1 Jul. 31, 2014

(30) Foreign Application Priority Data

Jan. 31, 2013 (JP) ................................. 2013-017142

(51) Int. Cl.
| | |
|---|---|
| H01L 21/30 | (2006.01) |
| H01L 29/739 | (2006.01) |
| H01L 29/40 | (2006.01) |
| H01L 23/29 | (2006.01) |

(52) U.S. Cl.
CPC .......... *H01L 29/7397* (2013.01); *H01L 29/407* (2013.01); *H01L 23/293* (2013.01); *H01L 2924/0002* (2013.01)

(58) Field of Classification Search
USPC .......... 438/455, 458, 459, 460; 257/E21.567, 257/E21.599
See application file for complete search history.

(56) References Cited

U.S. PATENT DOCUMENTS

| | | | |
|---|---|---|---|
| 2005/0233499 | A1 | 10/2005 | Okuda et al. |
| 2013/0105949 | A1* | 5/2013 | Sasaki et al. .................. 257/620 |

FOREIGN PATENT DOCUMENTS

| | | | | |
|---|---|---|---|---|
| JP | A-2005-26377 | | 1/2005 | |
| JP | 2005-303218 | * | 10/2005 | .............. H01L 29/41 |
| JP | 2005303218 | A | 10/2005 | |
| JP | A-2005-317570 | | 11/2005 | |

OTHER PUBLICATIONS

Machine Translation of JP-2005-30218.*

* cited by examiner

*Primary Examiner* — Julia Slutsker
(74) *Attorney, Agent, or Firm* — Oliff PLC

(57) ABSTRACT

A method for manufacturing a semiconductor device includes: forming, in element regions of a semiconductor wafer, electrodes and a insulator on peripheral part of the electrodes so that a height of the insulator is higher than that of the electrodes; forming, on the front face of the semiconductor wafer, a groove for surrounding a periphery of the electrodes with the insulator being sandwiched between the electrodes and the groove, the groove being formed so that a height of the groove is lower than that of the insulator and the groove extends to an outer circumferential edge of the semiconductor wafer; bonding adhesives onto the electrodes in the element regions so that a height of the adhesives is higher than that of the insulator, and bonding, onto the adhesives, a base material for covering the front face of the semiconductor wafer; and processing a rear face of the semiconductor wafer.

5 Claims, 3 Drawing Sheets

US 9,166,029 B2

METHOD FOR MANUFACTURING SEMICONDUCTOR DEVICE

INCORPORATION BY REFERENCE

The disclosure of Japanese Patent Application No. 2013-017142 filed on Jan. 31, 2013 including the specification, drawings and abstract is incorporated herein by reference in its entirety.

BACKGROUND OF THE INVENTION

1. Field of the Invention

The present invention relates to a production method of a semiconductor device, a semiconductor wafer, and the semiconductor device.

2. Description of Related Art

Japanese Patent Application Publication No. 2005-317570 (JP 2005-317570 A) discloses a production method of the semiconductor device in which a protective tape is attached to a front side surface of the semiconductor wafer where an electrode and an insulating layer are formed, and a back side of the semiconductor wafer is processed in a state where the protective tape is kept attached.

A step is formed between the electrode and the insulating layer that are formed on the front side surface of the semiconductor wafer. Thus, in the technique disclosed in JP 2005-317570 A, when the protective tape is attached to the front side surface of the semiconductor wafer, a clearance may be formed between the semiconductor wafer and the protective tape at the step between the electrode and the insulating layer. In this case, air is sealed in the clearance between the semiconductor wafer and the protective tape. Then, when the back side of the semiconductor wafer is processed, if the semiconductor wafer is placed under a vacuum environment, the air sealed in the clearance may expand, and the semiconductor wafer may be damaged.

SUMMARY OF THE INVENTION

An object of the present invention is to provide the production method of the semiconductor device, the semiconductor wafer, and the semiconductor device that can inhibit the semiconductor wafer from being damaged.

A method, according to one aspect of the invention, for manufacturing a semiconductor device includes: forming, in each of a plurality of element regions of a semiconductor wafer, surface electrodes and a insulating layer on peripheral parts of the surface electrodes so that a height of the insulating layer from a front face of the semiconductor wafer is higher than that of the surface electrodes; forming, on the front face of the semiconductor wafer, a dicing line groove for surrounding a periphery of the surface electrodes with the insulating layer being sandwiched between the surface electrodes and the dicing line groove in a plane view, the dicing line groove being formed so that a height of the dicing line groove from the front face of the semiconductor wafer is lower than that of the insulating layer and the dicing line groove extends to an outer circumferential edge of the semiconductor wafer; after forming the dicing line groove, bonding adhesive layers onto the surface electrodes in the each of the plurality of element regions so that a height of the adhesive layers from the front face of the semiconductor wafer is higher than that of the insulating layer, and bonding, onto a front side of the adhesive layers, a base material for covering the front face of the semiconductor wafer; and processing a rear face of the semiconductor wafer of which the front face is covered with the base material.

In this method, in a covering step, the adhesive layers are bonded onto the surface electrodes in each of the plurality of element regions and the base material for covering the front face of the semiconductor wafer is bonded onto the front side of the adhesive layers. Here, the height of the adhesive layers from the front face of the semiconductor wafer is higher than the height of the insulating layer from the front face of the semiconductor wafer. Further, the adhesive layers are disposed on the surface electrodes but are not disposed on the insulating layer, so that the base material is not bonded to the insulating layer. In view of this, even in a case where air enters between the base material and the semiconductor wafer in a step formed between the adhesive layer and the insulating layer, when the air expands, a gap communicating with the dicing line groove is easily formed between the base material and the insulating layer. Accordingly, the air thus entering between the base material and the semiconductor wafer is discharged outside via the dicing line groove. As a result, even if the semiconductor wafer is placed under a vacuum environment at the time of processing the rear face of the semiconductor wafer, it is possible to restrain the semiconductor wafer from being damaged.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

When a base material for covering a front face of a semiconductor wafer is bonded to a front side of an adhesive layer, a space may be formed between the base material and a front face of a insulating layer. According to this configuration, a space between the base material and the semiconductor wafer is unlikely to be tightly enclosed.

Surface electrodes adjacent to each other may be separated from each other by the insulating layer and the space.

In a covering step, one surface of a protective tape which surface includes a plurality of adhesive layers corresponding to respective surface electrodes in a plurality of element regions may be attached to the front face of the semiconductor wafer. According to this configuration, it is possible to cover the front face of the semiconductor wafer with the base material just by attaching the protective tape to the front face of the semiconductor wafer.

In the covering step, the adhesive layers may be bonded onto the respective surface electrodes of the plurality of element regions of the semiconductor wafer on which a dicing line groove is formed, and then the base material may be bonded to front sides of the adhesive layers.

First Embodiment

Figure 1:
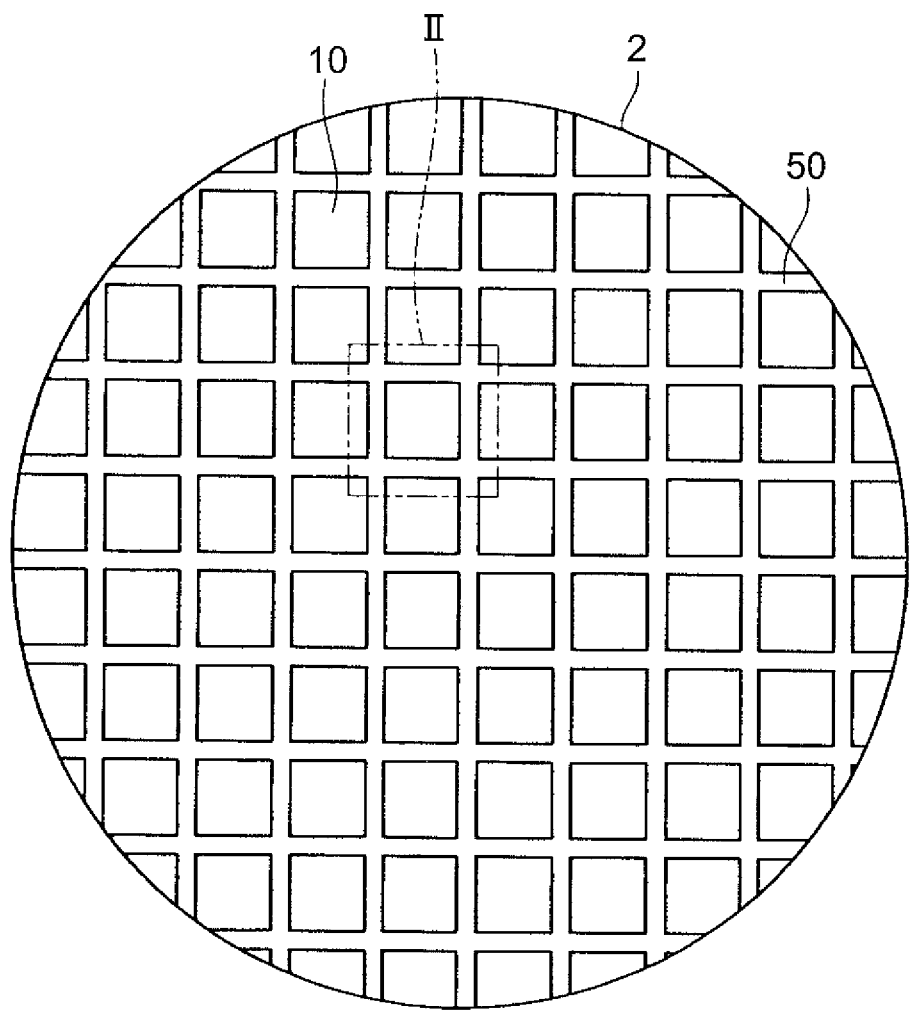
FIG. 1 is a plane view illustrating a semiconductor wafer according to a first embodiment.

A semiconductor device of the present embodiment is manufactured from a semiconductor wafer 2 illustrated in FIG. 1. The semiconductor wafer 2 illustrated in FIG. 1 is configured such that a front-face structure is formed on a front face thereof and a protective tape 60 (see FIG. 3) is attached thereto. With reference to FIG. 1, a configuration of the semiconductor device of the present embodiment and a configuration of the semiconductor wafer 2 are initially described. A semiconductor wafer 2 according to this embodiment that is shown in FIG. 1 is a substrate mainly made of silicon (Si). The semiconductor wafer 2 according to this embodiment includes a plurality of element regions 10 and dicing line grooves 50 that surround the element regions 10 and extend to the perimeter of the semiconductor wafer 2 in a planar view.

Figure 2:
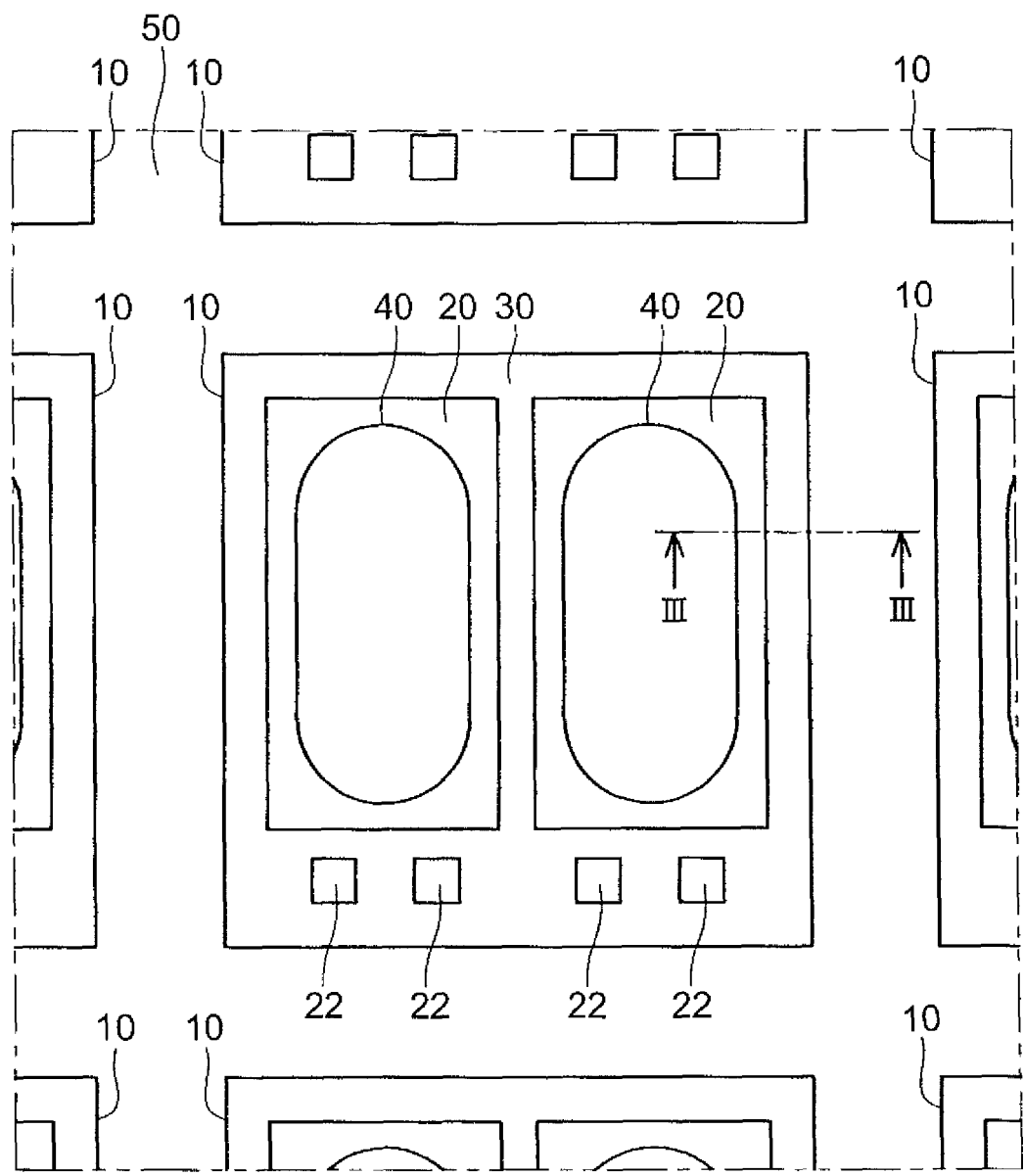
FIG. 2 is an enlarged view of a part II in FIG. 1.

As shown in FIG. 2, when the semiconductor wafer 2 is seen in a planar view, the element regions 10 are formed at regular intervals to each other. The element region 10 includes a plurality of surface electrodes 20, a plurality of signal pads 22, and insulating layers 30 that are formed in surroundings of the surface electrodes 20 and the signal pads 22. Note that FIG. 2 illustrates a state where adhesive layers 40 of the protective tape 60 (see FIG. 3) are bonded onto respective surface electrodes 20. In FIG. 2, a base material 45 (see FIG. 3) of the protective tape 60 is not illustrated. The protective tape 60 will be described later, more specifically.

Figure 3:
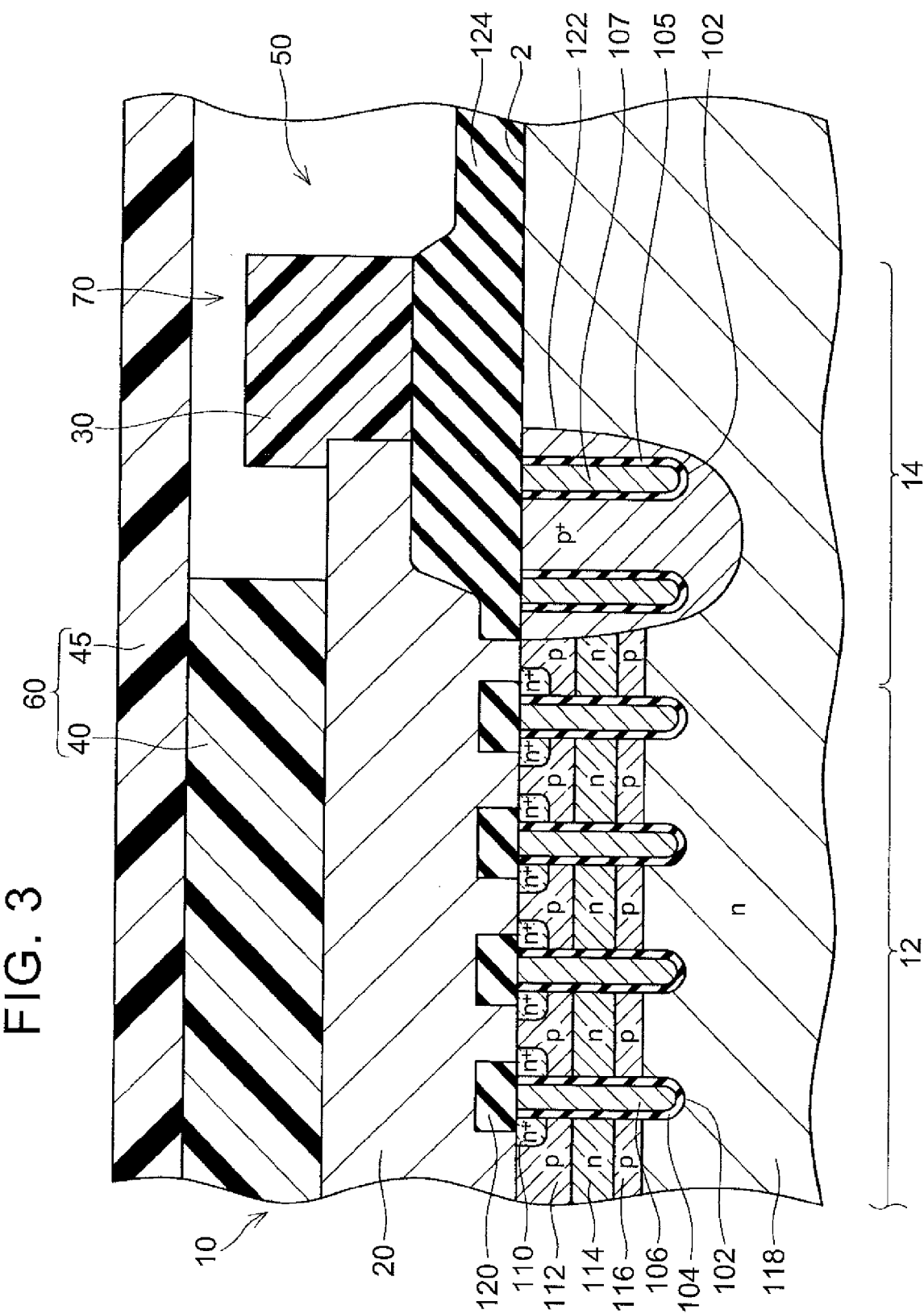
FIG. 3 is a sectional view taken along a line III-III in FIG. 2.

Surface structure of the element region 10 in the semiconductor wafer 2 is described further. As shown in FIG. 3, when the semiconductor wafer 2 is seen in a section taken along the line III-III in FIG. 2, the element region 10 in the semiconductor wafer 2 is formed with a cell region 12 and a termination region 14. However, the back side of the semiconductor wafer 2 according to this embodiment is unprocessed. The cell region 12 can be formed with an insulated-gate bipolar transistor (IGBT) or a diode, for example, by processing (such as thinning, impurity implantation, or electrode formation) of the back side. Thus, FIG. 3 does not clearly show the back side of the semiconductor wafer 2.

The cell region 12 includes a contact region 110, a top body region 112, a floating region 114, a bottom body region 116, and a drift region 118. The cell region 12 also includes a plurality of trenches 102, gate insulating films 104 that cover the inner surfaces of the trenches 102, and gate electrodes 106 that are covered with the gate insulating films 104 and accommodated in the trenches 102.

The contact region 110 is an n$^+$-type region and formed in a range that is exposed to a front side surface of the semiconductor wafer 2. The top body region 112 is a p-type region and disposed to the position that is deeper than the contact region 110. The floating region 114 is an n-type region and disposed to the position that is deeper than the top body region 112. The bottom body region 116 is a p-type region and disposed to the position that is deeper than the floating region 114. The bottom body region 116 is formed in a range that is shallower than a bottom end of the trench 102. The drift region 118 is an n-type region and disposed to the position that is deeper than the bottom body region 116.

The front side surface of the contact region 110 and a part of the front side surface of the top body region 112 are ohmically connected to the surface electrode 20.

The trench 102 is formed so as to pass from the front side surface of the semiconductor wafer 2 through the contact region 110, the top body region 112, the floating region 114, and the bottom body region 116. The bottom end of the trench 102 in the depth direction protrudes from the bottom end of the bottom body region 116 to the inside of the drift region 118. As described above, the inner surface of the trench 102 is covered with the gate insulating film 104. The gate electrode 106 is accommodated in the trench 102 in a state of being covered with the gate insulating film 104. The gate electrode 106 is covered with an interlayer insulating film 120 on the upper surface and insulated from the surface electrode 20. However, at the other position that is not shown in the drawing, the gate electrode 106 is connected to the signal pad 22 (see FIG. 2).

The termination region 14 is a region that is formed in the outer periphery of the element region 10. The termination region 14 includes a separate region 122, the plurality of trenches 102, insulating films 105, and conductor regions 107.

The separate region 122 is a p-type region and formed in a range that is exposed to the front side surface of the semiconductor wafer 2. The bottom end of the separate region 122 is formed at a deeper position than the bottom end of the trench 102. The trenches 102 within the termination region 14 are formed inside the separate region 122. The upper surface of the separate region 122 and the upper surfaces of the conductor regions 107 are covered with a termination insulating film 124 and insulated from the surface electrode 20.

As shown in FIG. 3, the surface electrode 20 is formed on the front side of the semiconductor wafer 2. The surface electrode 20 is ohmically connected to the front side surface of the contact region 110 and a part of the top body region 112 that is exposed to the front side surface of the semiconductor wafer 2. The surface electrode 20 is also insulated from the gate electrodes 106 and the conductor regions 107 by the interlayer insulating films 120 and the termination insulating film 124, respectively. An outer peripheral end of the surface electrode 20 is formed to overlap with the upper surface of the termination insulating film 124.

The insulating layer 30 is formed in the perimeter of the surface electrode 20 and on the front side of the termination insulating film 124. A part of the insulating layer 30 is formed to overlap with the perimeter of the surface electrode 20. In this embodiment, the insulating layer 30 is made of polyimide. In other examples, the insulating layer 30 may be made of other resin materials that have electrical insulation properties. As shown in FIG. 3, the height of the insulating layer 30 from the front side surface of the semiconductor wafer 2 is higher than that of the surface electrode 20.

The height of the dicing line groove 50 from the front side surface of the semiconductor wafer 2 is lower than that of the insulating layer 30. In addition, as shown in FIG. 2, when the semiconductor wafer 2 is seen in a planar view, the dicing line grooves 50 surround each element region 10 and extend to the perimeter of the semiconductor wafer 2.

In the present embodiment, the protective tape 60 is attached to the front face of the semiconductor wafer 2. The protective tape 60 includes the base material 45 for covering an entire front face of the semiconductor wafer 2, and the adhesive layers 40 bonded to that surface (a bottom face in FIG. 3) of the base material 45 which faces the semiconductor wafer 2. The base material 45 is, for example, a film made from a resin having electric insulation. The adhesive layers 40 are formed from an adhesive material made from a resin having electric insulation and adhesiveness. The adhesive layers 40 are provided on that surface of the base material 45 which faces the semiconductor wafer 2, so as to be placed at positions opposed to the respective surface electrodes 20 of each of the plurality of element regions 10 of the semiconductor wafer 2. Accordingly, as illustrated in FIG. 2, when the protective tape 60 is attached to the front face of the semiconductor wafer 2, the adhesive layers 40 are bonded onto the respective surface electrodes 20 of each of the plurality of element regions 10.

As illustrated in FIG. 3, a height of the adhesive layer 40 from the front face of the semiconductor wafer 2 is higher than that of the insulating layer 30. Further, no adhesive layer 40 is disposed at a position opposed to the insulating layer 30, so that the base material 45 is not bonded to the insulating layer 30. On that account, in the example illustrated in FIG. 3, a space 70 is formed between the base material 45 and a front face of the insulating layer 30. The space 70 communicates with the dicing line groove 50. Surface electrodes 20 of element regions 10 adjacent to each other in the semiconductor wafer 2 are separated from each other by the insulating layer 30 and the space 70.

In view of this, according to the semiconductor wafer 2 and the protective tape 60 of the present embodiment, the base material 45 is not bonded to the insulating layer 30. Accordingly, even if air exists between the base material 45 and the semiconductor wafer 2 in a step formed between the adhesive layer 40 and the insulating layer 30 and the air expands, the air is able to flow to the dicing line groove 50 via a gap (the space 70) between the base material 45 and the insulating layer 30. Accordingly, the air between the base material 45 and the semiconductor wafer 2 is discharged outside via the dicing line groove 50. As a result, as will be described later, even if the semiconductor wafer 2 is placed under a vacuum environment at the time of processing a rear face of the semiconductor wafer 2, it is possible to restrain the semiconductor wafer 2 from being damaged.

After the back side of the semiconductor wafer 2 is processed, the semiconductor wafer 2 may be cut into dies along the dicing line grooves 50. Consequently, a plurality of semiconductor devices formed in the semiconductor wafer can be divided into pieces. According to the structure of this embodiment, the semiconductor wafer 2 can be inhibited from being damaged during the processing of the back side, and a fabrication yield of the semiconductor device can be improved.

Next will be described a method for manufacturing a plurality of semiconductor devices by use of the semiconductor wafer 2 and the protective tape 60 described above. The following deals with a case where RC-IGBT including a diode region and an IGBT region is manufactured.

First, the semiconductor wafer 2 in which the cell region 12 and the termination region 14 (see FIG. 3) are fabricated in each of the element regions 10 is prepared.

Next, the interlayer insulating film 120 is formed on the front side surface of the cell region 12 by a well-known method. Furthermore, the termination insulating film 124 is formed on the front side surface of termination region 14. The termination insulating film 124 is also formed in a part between two adjacent element regions 10 on the front side surface of the semiconductor wafer 2 (see FIG. 3). Next, the surface electrode 20 (see FIG. 3) is formed on the front side surface of the element region 10 by a well-known method.

Subsequently, positive photosensitive polyimide is applied to an entire front face of the semiconductor wafer 2. After that, a mask is placed on the front face of the semiconductor wafer 2 and is subjected to exposure. The mask used in the exposure has openings for a part where the surface electrode 20 is formed, a part where the signal pad 22 is formed, and a part where the dicing line groove 50 is to be formed. Here, the part where the dicing line groove 50 is to be formed is a part around the element region 10 which part extends to an outer circumferential edge of the semiconductor wafer 2.

Subsequently, by use of a developer, the polyimide is removed from a part subjected to the exposure. Hereby, the polyimide applied to a front face of each of the surface electrodes 20 and the signal pads 22 is removed, so that the front face of the each of the surface electrodes 20 and the signal pads 22 is exposed (see FIG. 2). Further, the polyimide around each of the element regions 10 is also removed, so that the dicing line groove 50 is formed. The polyimide left as a result thereof forms the insulating layer 30.

Subsequently, as illustrated in FIG. 3, the protective tape 60 is attached to the front face of the semiconductor wafer 2. As described above, the protective tape 60 includes the adhesive layers 40 provided at the respective positions opposed to the respective surface electrodes 20 of each of the plurality of element regions 10 on that surface of the base material 45 which faces the semiconductor wafer 2. On that account, the protective tape 60 is positioned and attached so that the adhesive layers 40 are bonded onto the respective surface electrodes 20 of each of the plurality of element regions 10. When the protective tape 60 is attached as such, the adhesive layers 40 are bonded onto the respective surface electrodes 20 of each of the plurality of element regions 10, and the entire front face of the semiconductor wafer 2 is covered with the base material 45. As illustrated in FIG. 3, the height of the adhesive layer 40 from the front face of the semiconductor wafer 2 is higher than that of the insulating layer 30. Further, the base material 45 is not bonded to the insulating layer 30. On that account, as illustrated in FIG. 3, the space 70 is formed between the base material 45 and the front face of the insulating layer 30. The space 70 communicates with the dicing line groove 50. Further, surface electrodes 20 of element regions 10 adjacent to each other in the semiconductor wafer 2 are separated from each other by the insulating layer 30 and the space 70.

Subsequently, the rear face of the semiconductor wafer 2 is ground so that the semiconductor wafer 2 is formed into a thin plate. Then, a p-type dopant is injected into part of a rear face of the cell region 12 of the semiconductor wafer 2 thus formed into the thin plate, so as to form a collector region. A range where the collector region is formed becomes an IGBT region. On the other hand, an n-type dopant is injected into the other part of the rear face of the cell region 12 of the semiconductor wafer 2 thus formed into the thin plate. A cathode region is formed by the part where the n-type dopant is injected and the drift region 118. A range where the cathode region is formed becomes a diode region. As a result, RC-IGBT is formed within the element region 10.

A step of injecting the p-type dopant or the n-type dopant into the rear face of the cell region 12 is performed under a vacuum environment. At this time, even if air exists between the base material 45 and the semiconductor wafer 2 in the step formed between the adhesive layer 40 and the insulating layer 30, the space 70 is formed between the base material 45 and the insulating layer 30. In view of this, even if the air expands, the air is discharged outside via the space 70 and the dicing line groove 50. As a result, even if the semiconductor wafer 2 is placed under a vacuum environment, it is possible to restrain the semiconductor wafer 2 from being damaged.

After that, ashing is performed on the rear face of the semiconductor wafer 2, so as to remove a resist for masking that is applied to the rear face of the semiconductor wafer 2 at the time of injecting the dopant. This ashing step is also performed under a vacuum environment, but it is also possible to restrain the semiconductor wafer 2 from being damaged, similarly to the above.

Thereafter, a rear-face electrode is formed on the rear face of the semiconductor wafer 2 by a well-known method. Then, the protective tape 60 is removed from the front face of the semiconductor wafer 2 by a well-known method.

Subsequently, a well-known dicing tape is attached to the rear face of the semiconductor wafer 2. Then, dicing is performed on the semiconductor wafer 2 along the dicing line groove 50. Hereby, a plurality of semiconductor devices (RC-IGBT) formed on the semiconductor wafer 2 are separated from each other, and thus, the plurality of semiconductor devices (RC-IGBT) is manufactured.

The method for manufacturing a plurality of semiconductor devices by use of the semiconductor wafer 2 and the protective tape 60 has been described above. As mentioned above, in the method of the present embodiment, when the protective tape 60 is attached to the front face of the semiconductor wafer 2, the base material 45 is not bonded to the insulating layer 30. On that account, even if air enters between the base material 45 and the semiconductor wafer 2, the air is discharged outside via the gap between the base material 45 and the insulating layer 30 and the dicing line groove 50 at the time of processing (injection of the dopant, ashing, and the like) on the rear face of the semiconductor wafer 2. This consequently makes it possible to restrain the semiconductor wafer 2 from being damaged. As a result, it is possible to improve a manufacturing yield of a semiconductor device.

The following describes a corresponding relationship between the present embodiment and recitations in Claims. The surface electrode 20 and the signal pad 22 are an example of a "surface electrode". The step of forming the surface electrodes 20 on the front face of the element region 10, and then simultaneously forming the dicing line groove 50 and the insulating layer 30 by use of positive photosensitive polyimide is an example of a "forming, in each of a plurality of element regions of a semiconductor wafer, surface electrodes and a insulating layer on peripheral parts of the surface electrodes so that a height of the insulating layer from a front face of the semiconductor wafer is higher than that of the surface electrodes". Further, the step of simultaneously forming the dicing line groove 50 and the insulating layer 30 is also an example of a "forming, on the front face of the semiconductor wafer, a dicing line groove for surrounding a periphery of the surface electrodes with the insulating layer being sandwiched between the surface electrodes and the dicing line groove in a plane view, the dicing line groove being formed so that a height of the dicing line groove from the front face of the semiconductor wafer is lower than that of the insulating layer and the dicing line groove extends to an outer circumferential edge of the semiconductor wafer". The step of attaching the protective tape 60 to the front face of the semiconductor wafer 2 is an example of a "bonding adhesive layers onto the surface electrodes in the each of the plurality of element regions so that a height of the adhesive layers from the front face of the semiconductor wafer is higher than that of the insulating layer, and bonding, onto a front side of the adhesive layers, a base material for covering the front face of the semiconductor wafer".

Second Embodiment

The following describes a method for manufacturing a semiconductor device according to a second embodiment, and mainly describes a point different from the first embodiment. The present embodiment is different from the first embodiment in the step of covering the front face of the semiconductor wafer 2 with the base material 45. In the first embodiment, the front face of the semiconductor wafer 2 is covered with the base material 45 by attaching the protective tape 60 to the front face of the semiconductor wafer 2. On the other hand, in the present embodiment, after a dicing line groove 50 and a insulating layer 30 are formed, adhesive layers 40 are initially bonded onto respective surface electrodes 20 of each of a plurality of element regions 10 in a semiconductor wafer 2. The adhesive layers 40 are the same as those in the first embodiment. After the adhesive layers 40 are bonded onto the surface electrodes 20, a base material 45 is bonded onto a front side of the adhesive layers 40. Hereby, an entire front face of the semiconductor wafer 2 is covered with the base material 45.

Even in a case where the front face of the semiconductor wafer 2 is covered with the base material 45 according to the method of the present embodiment, it is possible to yield the same effect as in the first embodiment. In the present embodiment, the step of bonding the adhesive layers 40 onto the respective surface electrodes 20 of each of the plurality of element regions 10 and the step of subsequently bonding the base material 45 onto the front-front side of the adhesive layers 40 are an example of the "bonding adhesive layers onto the surface electrodes in the each of the plurality of element regions so that a height of the adhesive layers from the front face of the semiconductor wafer is higher than that of the insulating layer, and bonding, onto a front side of the adhesive layers, a base material for covering the front face of the semiconductor wafer".

While techniques disclosed herein have been described in detail with reference to example embodiments thereof, it is to be understood that those examples are merely illustrative and the present invention is not limited to those examples. For example, the following modifications may be used.

Modification 1

In the embodiment described above, the dicing line groove 50, and the insulating layer 30 are formed by using the positive-type photosensitive polyimide. However, the present invention is not limited to this, and the dicing line groove 50, and the insulating layer 30 may be formed by using non-photosensitive polyimide. In this case, after the non-photosensitive polyimide is applied on the entire front side surface of the semiconductor wafer 2, the resist that becomes the mask is applied on the surface of the applied non-photosensitive polyimide, and then the openings are formed in the part where the surface electrode 20 is formed, the part where the signal pad 22 is formed, and the part where the dicing line groove 50 is formed. After that, the polyimide in the part that is not masked by the resist is removed by means of the developer. As a result, the dicing line groove 50, and insulating layer 30 can be formed in a similar manner as described above.

Modification 2

In the embodiment described above, although the dicing line groove 50, and the insulating layer 30 are formed at the same time, the dicing line groove 50, and the insulating layer 30 can be formed separately in different processes.

Modified Embodiment 3

In each of the above embodiments, when the front face of the semiconductor wafer 2 is covered with the base material 45, the space 70 is formed between the base material 45 and the insulating layer 30 (see FIG. 3). The invention is not limited to this, and the space 70 may not be formed between the base material 45 and the insulating layer 30 when the front face of the semiconductor wafer 2 is covered with the base material 45. However, even in this case, no adhesive layer 40 is disposed at the position opposed to the insulating layer 30, and the base material 45 is not bonded to the insulating layer 30. Even in the case of this modified embodiment, the base material 45 is not bonded to the insulating layer 30, so that when air entering between the base material 45 and the semiconductor wafer 2 expands, a gap communicating with the dicing line groove 50 is easily formed between the base material 45 and the insulating layer 30. As a result, it is possible to yield the same effect as in each of the above embodiments.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A method for manufacturing a semiconductor device, the method comprising:
    forming, in each of a plurality of element regions of a semiconductor wafer, surface electrodes and a insulating layer on peripheral parts of the surface electrodes so that a height of the insulating layer from a front face of the semiconductor wafer is higher than that of the surface electrodes;
    forming, on the front face of the semiconductor wafer, a dicing line groove for surrounding a periphery of the surface electrodes with the insulating layer being sandwiched between the surface electrodes and the dicing line groove in a plane view, the dicing line groove being formed so that a height of the dicing line groove from the front face of the semiconductor wafer is lower than that of the insulating layer and the dicing line groove extends to an outer circumferential edge of the semiconductor wafer;
    after forming the dicing line groove, bonding adhesive layers onto the surface electrodes in the each of the plurality of element regions so that a height of the adhesive layers from the front face of the semiconductor wafer is higher than that of the insulating layer, and bonding, onto a front side of the adhesive layers, a base material for covering the front face of the semiconductor wafer; and
    processing a rear face of the semiconductor wafer of which the front face is covered with the base material,
    wherein the adhesive layers are formed without having a part disposed on the insulating layer whereby no part of the adhesive layers is formed between the insulating layer and the base material.

2. The method for manufacturing a semiconductor device according to claim 1, wherein:
    in the bonding of the base material for covering the front face of the semiconductor wafer onto the front side of the adhesive layers, a space is formed between the base material and a front face of the insulating layer.

3. The method for manufacturing a semiconductor device, according to claim 2, wherein:
    the surface electrodes and the insulating layer are formed such that surface electrodes adjacent to each other are separated from each other by the insulating layer and the space.

4. The method for manufacturing a semiconductor device according to claim 1, wherein:
    the bonding of the adhesive layers onto the surface electrodes in the each of the plurality of element regions and the bonding of the base material onto the front side of the adhesive layers include attaching, to the front face of the semiconductor wafer, a protective tape of which one surface includes the adhesive layers so as to correspond to the surface electrodes in the each of the plurality of element regions.

5. The method for manufacturing a semiconductor device according to claim 1, wherein:
    the bonding of the adhesive layers onto the surface electrodes in the each of the plurality of element regions and the bonding of the base material onto the front side of the adhesive layers include bonding the adhesive layers onto the surface electrodes in the each of the plurality of element regions of the semiconductor wafer in which the dicing line groove is formed, and then bonding the base material onto the front side of the adhesive layers.

* * * * *